United States Patent
Ker et al.

(10) Patent No.: US 7,064,942 B2
(45) Date of Patent: Jun. 20, 2006

(54) ESD PROTECTION CIRCUIT WITH TUNABLE GATE-BIAS

(75) Inventors: Ming-Dou Ker, Hsinchu (TW); Wen-Yu Lo, Taichung Hsien (TW)

(73) Assignee: Silicon Integrated Systems Corp., Hsinchu (TW)

( * ) Notice: Subject to any disclaimer, the term of this patent is extended or adjusted under 35 U.S.C. 154(b) by 325 days.

(21) Appl. No.: 10/440,083

(22) Filed: May 19, 2003

(65) Prior Publication Data
US 2004/0233595 A1 Nov. 25, 2004

(51) Int. Cl.
*H02H 9/00* (2006.01)
(52) U.S. Cl. .......................... 361/56; 361/111
(58) Field of Classification Search ................ 327/313, 327/314, 884, 434, 437; 361/56, 111
See application file for complete search history.

(56) References Cited

U.S. PATENT DOCUMENTS

| | | | | |
|---|---|---|---|---|
| 5,550,497 A | * | 8/1996 | Carobolante | 327/110 |
| 5,754,388 A | * | 5/1998 | Schmidt | 361/215 |
| 6,097,229 A | * | 8/2000 | Hinterscher | 327/199 |
| 6,249,410 B1 | | 6/2001 | Ker et al. | |
| 6,388,850 B1 | * | 5/2002 | Ker et al. | 361/56 |
| 6,628,159 B1 | * | 9/2003 | Voldman | 327/534 |
| 6,671,153 B1 | * | 12/2003 | Ker et al. | 361/111 |
| 2002/0135565 A1 | * | 9/2002 | Gordon et al. | 345/169 |
| 2003/0139024 A1 | * | 7/2003 | Ker et al. | 438/517 |

* cited by examiner

Primary Examiner—Stephen W. Jackson
(74) Attorney, Agent, or Firm—Birch, Stewart, Kolasch & Birch, LLP

(57) ABSTRACT

An ESD protection circuit with tunable gate-bias coupled between a first and second pads for receiving power supply voltages. The ESD protection circuit includes a diode, a resistor coupled between the cathode of the diode and the first pad, a capacitor coupled between the cathode of the diode and the second pad, a first transistor of a first conductivity type having a gate coupled to the cathode of the diode, a drain coupled to the anode of the diode and a source coupled to the second pad, a second transistor of a second conductivity type having a gate coupled to the cathode of the diode, a drain coupled to the anode of the diode and a source coupled to the first pad, and a third transistor of the first conductivity type having a gate coupled to the anode of the diode, a drain coupled to the first pad and a source coupled to the second pad.

12 Claims, 12 Drawing Sheets

US 7,064,942 B2

ESD PROTECTION CIRCUIT WITH TUNABLE GATE-BIAS

BACKGROUND OF THE INVENTION

1. Field of the Invention

The present invention relates to an ESD protection circuit and particularly to an ESD protection circuit with tunable gate-bias.

2. Description of the Prior Art

Traditional gate-driven or gate-coupled techniques are widely used in ESD protection circuit design. These two techniques can provide a gate-bias voltage of the ESD protection device under ESD-stress conditions. With the gate-bias voltage, the trigger voltage of the ESD protection device can be reduced, and the turn-on uniformity and turn-on efficiency can be enhanced.

FIG. 1 is a diagram showing a conventional gate-coupled input ESD protection circuit. The input ESD protection circuit includes an NMOS transistor MNESD providing the source and drain respectively coupled to a VSS and input pad, a PMOS transistor MPESD with the source and drain coupled to a VDD pad and the input pad, resistors R1 and R2 respectively coupled between the gate of the transistor MNESD and VSS pad, and the gate of the transistor MPESD and VDD pad, and capacitors C1 and C2 respectively coupled between the gate of the transistor MNESD and input pad, and the gate of the transistor MPESD and input pad.

The capacitors C1 and C2 are used to couple the ESD transient voltage from the input pad to the gate of the ESD protection transistors MNESD and MPESD. With a coupled voltage on the gate of the ESD protection transistors MNESD and MPESD, all the fingers of the ESD protection transistors MNESD and MPESD can be uniformly turned on to bypass the ESD current and dissipate the charge from the input pad.

FIG. 2 is a diagram showing a conventional gate-driven ESD protection circuit between the power supply voltage source VDD and the substrate biasing voltage source VSS pad. The circuit includes a PMOS transistor MP1 with the bulk and source commonly coupled to a VDD pad, an NMOS transistor MN1 with the bulk and source commonly coupled to a VSS pad, and the gate and drain respectively coupled to the gate and drain of the transistor MP1, a resistor R coupled between the VDD pad and the gates of transistors MP1 and MN1, a capacitor C coupled between the VSS pad and the gates of the transistors MP1 and MN1, and an NMOS transistor MNESD with the gate coupled to the drains of the transistor MP1 and MN1, and the source and drain respectively coupled to the VSS and VDD pad. When a positive ESD pulse is applied to the VDD pad, a transient voltage difference is generated across the resistor R and turns on the transistor MP1, which increases the gate voltage of the transistor MNESD and turns on the transistor MNESD so that an ESD current path from the VDD to the VSS pad is formed through the turned-on MNESD.

FIG. 3 is a diagram showing another conventional gate-driven ESD protection circuit. It is noted that there are two transistors MP2 and MN2 additional to the circuit shown in FIG. 2. The operation of the circuit is similar to that of the circuit in FIG. 2. When a positive ESD pulse is applied to the VDD pad, a transient voltage difference is generated across the resistor R and turns on the transistor MP1, which increases the gate voltage of the transistor MN2 and turns on the transistor MN2. Thus, the gate voltage of the transistor MPESD is pulled down to the VSS and turns on the transistor MPESD so that an ESD current path from the VDD to the VSS pad is formed through the turned-on MPESD.

However, in the deep-submicron CMOS process, if the voltage level at the gate of the ESD protection NMOS transistor MNESD is at a high voltage level during the extreme voltage level from contact with an ESD source, a surface channel of the ESD protection NMOS transistor MNESD is formed, and the ESD current is discharged through the much shallower surface channel of the ESD protection NMOS transistor MNESD. The ESD current is often on the order of several amperes (A). For example, a 2-KV human-body-model (HBM) ESD event can generate an ESD current of about 1.33 A. Such a large ESD current flowing through the shallower surface channel forces a very high current density and can easily destroy the ESD protection NMOS transistor MNESD even if the ESD protection NMOS transistor MNESD has a relatively huge device dimension. This phenomenon generally causes a much lower ESD voltage level to be sustained by the ESD protection NMOS transistor MNESD. This phenomenon has been referred to as the "overstress gate-driven effect". Thus, there exists a design window for the gate-bias voltage, which is explained in J. Chen et al, "Design Methodology and Optimization of Gate-Driven NMOS ESD Protection Circuits in Submicron CMOS Processes", IEEE Trans. on Electron Devices, vol. 45, No. 12, pp. 2448–2456, December 1998. If too high the gate-bias voltage is applied, the ESD immunity of the ESD protection device will degrade. The suitable range of the gate-biased voltage of the ESD protection device mainly depends on technology and the process itself.

To solve the problem, U.S. Pat. No. 6,249,410 provides ESD protection circuits without overstress gate-driven effect, as shown in FIG. 4~6. It is noted that the circuits in FIG. 4~6 are derived by adding a diode between the gate and the source of each ESD protection transistor in FIG. 1~3. To prevent excess voltage from forming, when the ESD pulse is applied to the pad, the diode is turned on to clamp the voltage level on the gate of the ESD protection transistor at a level sufficient to turn on the ESD protection transistor but not cause damage.

The present invention provides other novel gate-driven and gate-coupled ESD protection circuits with tunable gate-bias to prevent the ESD immunity degradation due to the overstress gate-driven effect.

SUMMARY OF THE INVENTION

The object of the present invention is to provide an ESD protection circuit with tunable gate-bias.

The present invention provides a first ESD protection circuit with tunable gate-bias coupled between a first and second pad respectively for receiving a first and second power supply voltage. The ESD protection circuit includes a diode having an anode and cathode, a resistor coupled between the cathode of the diode and the first pad, a capacitor coupled between the cathode of the diode and the second pad, a first transistor of a first conductivity type having a gate coupled to the cathode of the diode, a drain coupled to the anode of the diode and a source coupled to the second pad, a second transistor of a second conductivity type having a gate coupled to the cathode of the diode, a drain coupled to the anode of the diode and a source coupled to the first pad, and a third transistor of the first conductivity type having a gate coupled to the anode of the diode, a drain coupled to the first pad and a source coupled to the second pad.

The present invention provides a second ESD protection circuit with tunable gate-bias coupled between a first and second pad respectively for receiving a first and second power supply voltage. The ESD protection circuit includes a first diode having an anode and cathode, a second diode having an anode and cathode coupled to the cathode of the first diode, a resistor coupled between the anode of the second diode and the first pad, a capacitor coupled between the anode of the second diode and the second pad, a first transistor of a first conductivity type having a gate coupled to the cathode of the first diode, a drain coupled to the anode of the first diode and a source coupled to the second pad, a second transistor of a second conductivity type having a gate coupled to the anode of the second diode, a drain coupled to the anode of the first diode and a source coupled to the first pad, and a third transistor of the first conductivity type having a gate coupled to the anode of the first diode, a drain coupled to the first pad and a source coupled to the second pad.

The present invention provides a third ESD protection circuit with tunable gate-bias coupled between a first and second pad respectively for receiving a first and second power supply voltage. The ESD protection circuit includes a first transistor of a second conductivity type, a diode having a cathode coupled to a drain of the first transistor, a resistor coupled between the anode of the diode and the first pad, a capacitor coupled between the anode of the diode and the second pad, a second transistor of a first conductivity type having a gate coupled to the cathode of the diode, a drain coupled to a source of the first transistor and a source coupled to the second pad, a third transistor of the second conductivity type having a gate coupled to the anode of the diode, a drain coupled to the source of the first transistor and a source coupled to the first pad, and a fourth transistor of the first conductivity type having a gate coupled to the source of the first transistor, a drain coupled to the first pad and a source coupled to the second pad.

The present invention provides a fourth ESD protection circuit with tunable gate-bias coupled among a first, second and third pad respectively for receiving a first power supply voltage, an input signal and a second power supply voltage. The ESD protection circuit includes a first diode having an anode and cathode, a first resistor coupled between the cathode of the first diode and the first pad, a first capacitor coupled between the cathode of the first diode and the second pad, a first transistor having a gate coupled to the cathode of the first diode, a drain coupled to the second pad, a source coupled to the first pad and a bulk coupled to the anode of the first diode, a second diode having an anode and cathode, a second resistor coupled between the anode of the second diode and the third pad, a second capacitor coupled between the anode of the second diode and the second pad, a second transistor having a gate coupled to the anode of the second diode, a drain coupled to the second pad, a source coupled to the third pad and a bulk coupled to the cathode of the second diode.

The present invention provides a fifth ESD protection circuit with tunable gate-bias coupled between a first and second pad respectively for receiving a first and second power supply voltage. The ESD protection circuit includes a diode having an anode and cathode, a first transistor of a first conductivity type having a gate coupled to the anode of the diode, a drain coupled to the cathode of the diode and a source coupled to the second pad, a second transistor of a second conductivity type having a gate coupled to the anode of the diode, a drain coupled to the cathode of the diode and a source coupled to the first pad, a third transistor of the first conductivity type having a gate, a drain coupled to the anode of the diode and a source coupled to the second pad, a fourth transistor of the second conductivity type having a gate coupled to the gate of the third transistor, a drain coupled to the anode of the diode and a source coupled to the first pad, a fifth transistor of the second conductivity type having a gate coupled to the cathode of the diode, a source coupled to the first pad and a drain coupled to the second pad, a resistor coupled between the gate of the third transistor and the first pad, and a capacitor coupled between the gate of the third transistor and the second pad.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1:
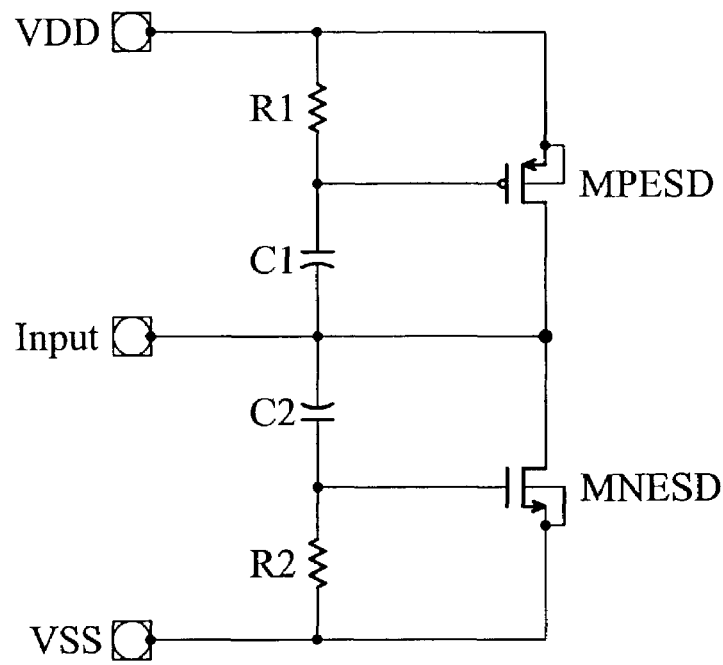
FIG. 1 is a diagram showing a conventional gate-coupled input ESD protection circuit.
Figure 2:
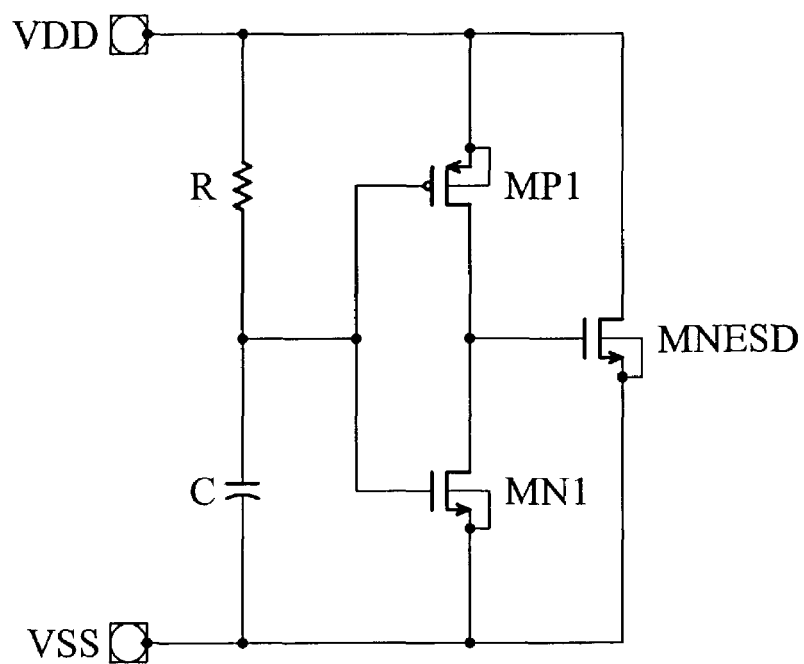
FIG. 2 is a diagram showing a conventional gate-driven ESD protection circuit between the power supply voltage source VDD and the substrate biasing voltage source VSS pad.
Figure 3:
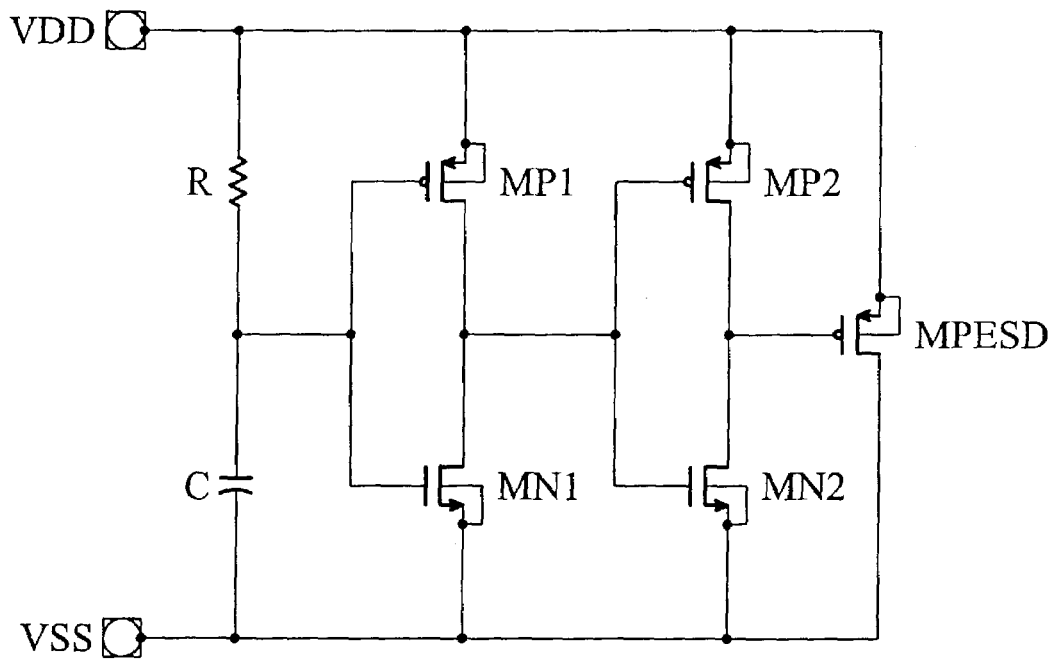
FIG. 3 is a diagram showing another conventional gate-driven ESD protection circuit.
Figure 4:
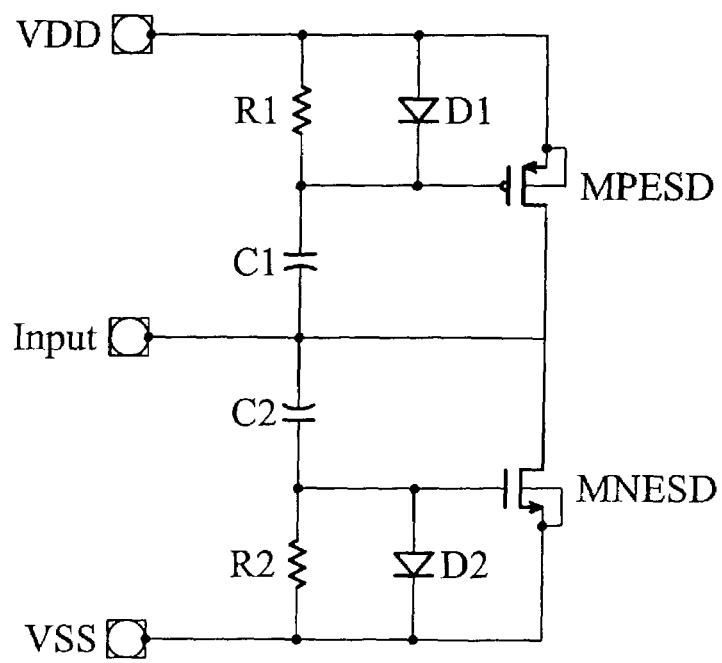
FIGS. 4~6 show the ESD protection circuits without overstress gate-driven effect disclosed in U.S. Pat. No. 6,249,410.
Figure 5:
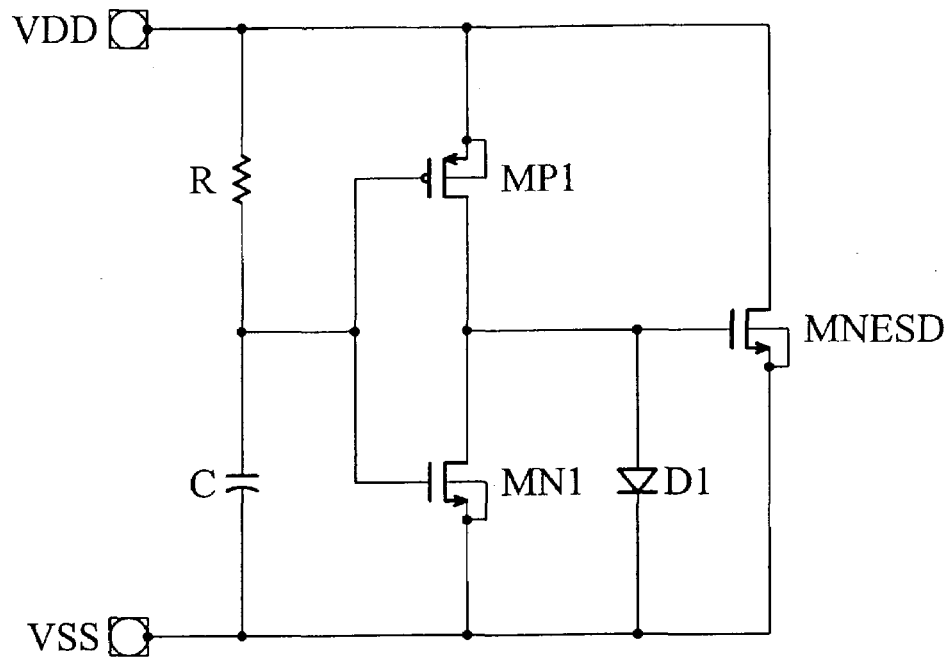
Figure 6:
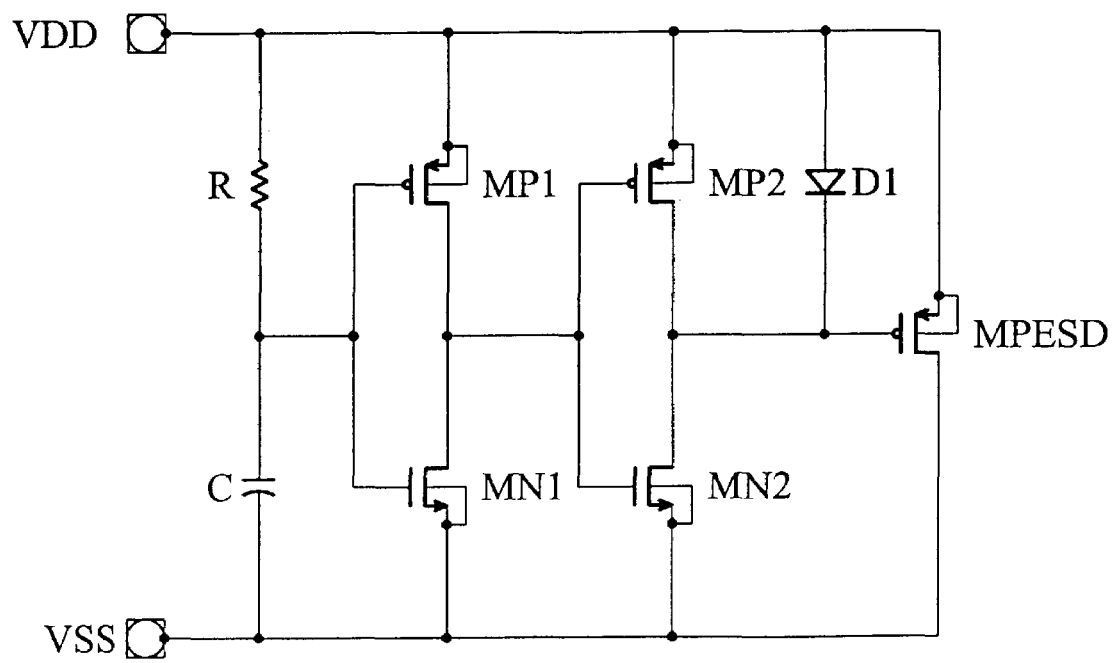
Figure 7A:
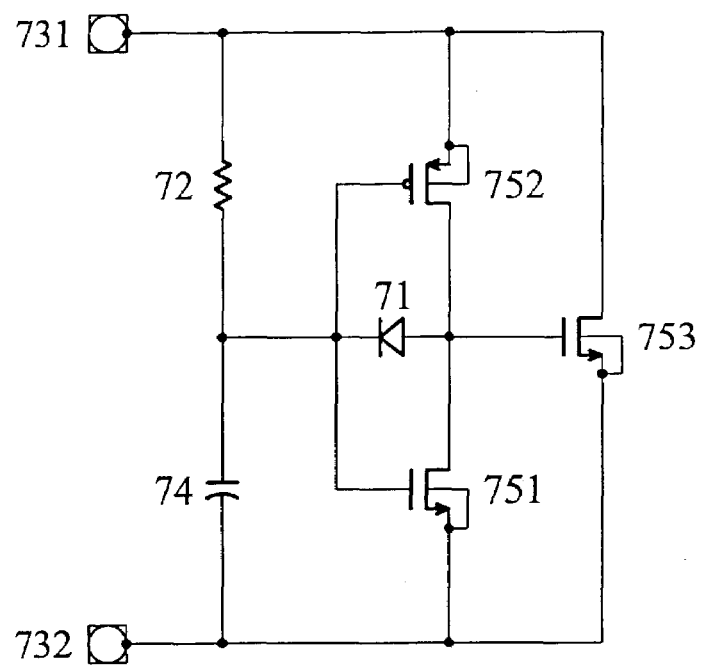
FIGS. 7A, 7B and 7C are diagrams showing a gate-driven ESD protection circuit and its alternatives according to a first embodiment of the invention.

FIG. 7A is a diagram showing a gate-driven ESD protection circuit placed between the power supply voltage source VDD and the substrate bias voltage source VSS pads according to a first embodiment of the invention. The ESD protection circuit includes a diode 71, a resistor 72 coupled between the cathode of the diode 71 and a VDD pad 731, a capacitor 74 coupled between the cathode of the diode 71 and a VSS pad 732, an NMOS transistor 751 having a gate coupled to the cathode of the diode 71, a drain coupled to the anode of the diode 71 and a source coupled to the VSS pad 732, a PMOS transistor 752 having a gate coupled to the cathode of the diode 71, a drain coupled to the anode of the diode 71 and a source coupled to the VDD pad 731, and an NMOS transistor 753 having a gate coupled to the anode of the diode 71, a drain coupled to the VDD pad 731 and a source coupled to the VSS pad 732. The bulks of the transistors 751, 752 and 753 are respectively coupled to the VSS pad 732, VDD pad 731 and VSS pad 732.

When a positive ESD pulse is applied to the VDD pad 731, there is a large transient voltage difference across the resistor 72 due to the RC delay effect with the capacitor 74. This voltage difference turns on the PMOS transistor 752, which increases the gate voltage of the NMOS transistor 753. The gate voltage of the NMOS transistor 753 is limited by the diode 71 and NMOS transistor 751, and has a maximum of Vd+Vth, where Vd is the turn-on voltage of the diode 71 and Vth is the threshold voltage of the transistor 751.

Figure 7B:
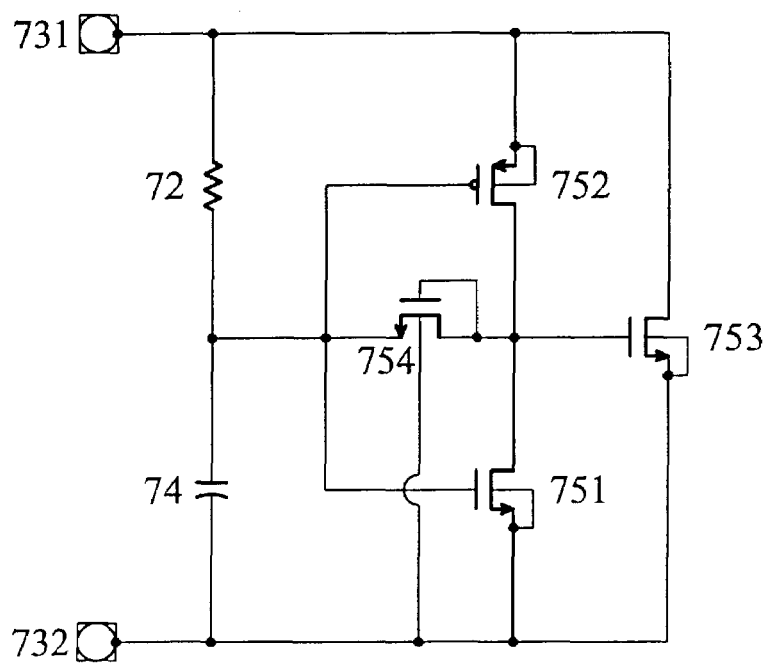
Figure 7C:
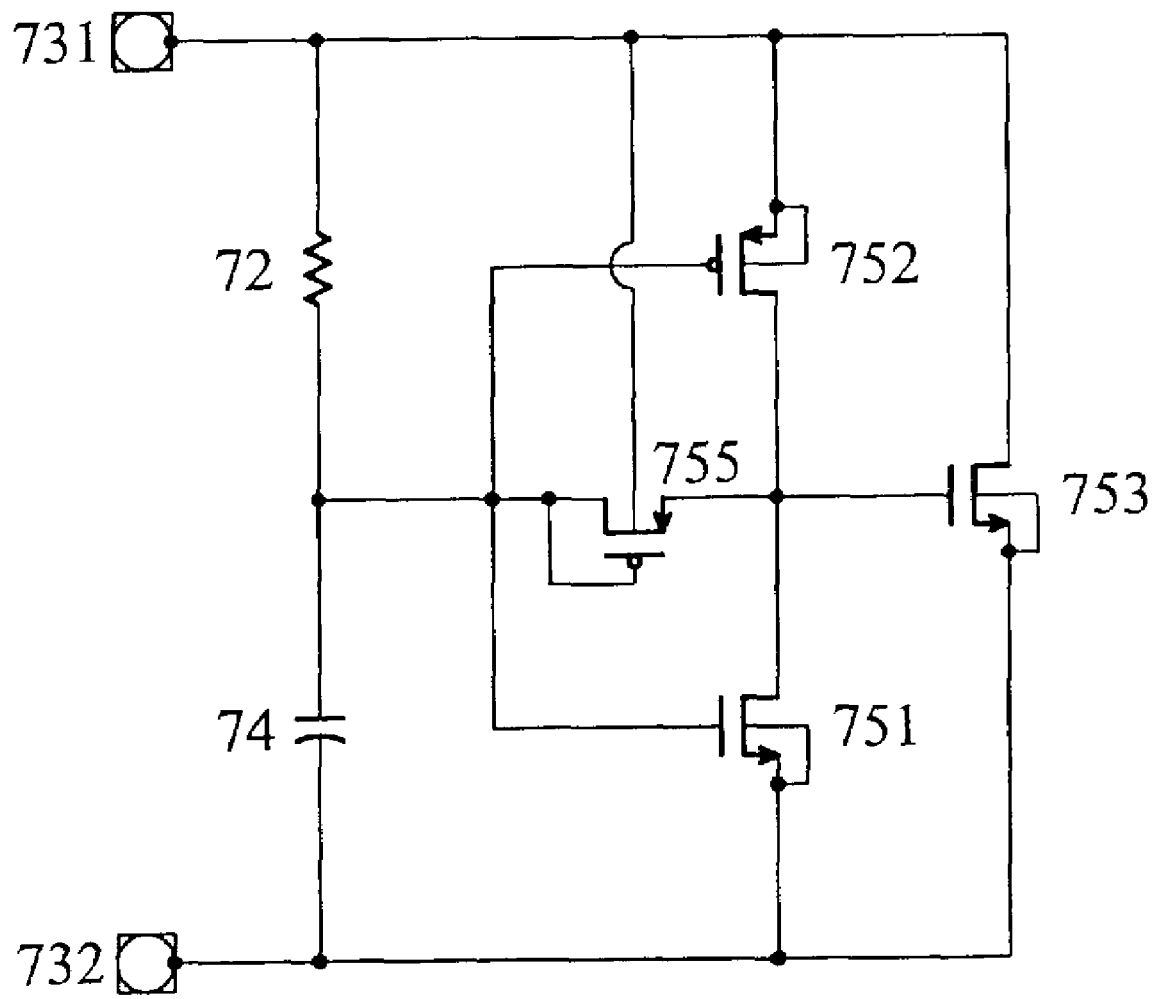

Alternatively, the diode 71 may be replaced by an NMOS transistor 754 having a drain used as the anode, a source used as the cathode, a bulk coupled to the VSS pad 732, and a gate coupled to the drain, as shown in FIG. 7B. The diode 71 may be also replaced by a PMOS transistor 755 having a drain used as the cathode, a source used as the anode, a bulk coupled to the VDD pad 731, and a gate coupled to the drain, as shown in FIG. 7C.

Figure 8A:
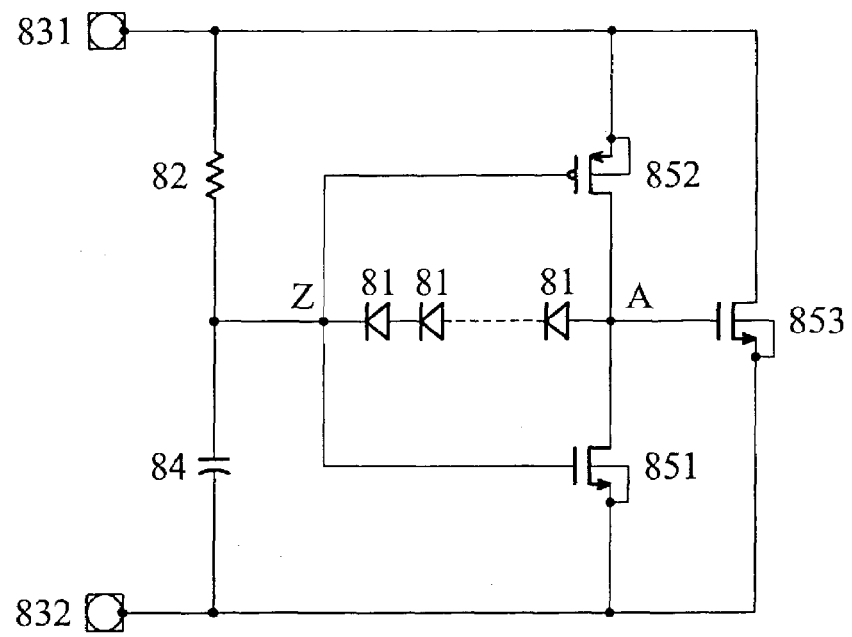
FIGS. 8A, 8B, 8C and 8D are diagrams showing a gate-driven ESD protection circuit and its alternatives according to a second embodiment of the invention.

FIG. 8A is a diagram showing a gate-driven ESD protection circuit placed between the power supply voltage source VDD and the substrate bias voltage source VSS pads according to a second embodiment of the invention. The ESD protection circuit includes a series of diodes 81 coupled in the same direction having an anode A and cathode Z on each end, a resistor 82 coupled between the cathode Z and a VDD pad 831, a capacitor 84 coupled between the cathode Z and a VSS pad 832, an NMOS transistor 851 having a gate coupled to the cathode Z, a drain coupled to the anode A and a source coupled to the VSS pad 832, a PMOS transistor 852 having a gate coupled to the cathode Z, a drain coupled to the anode A and a source coupled to the VDD pad 831, and an NMOS transistor 853 having a gate coupled to the anode A, a drain coupled to the VDD pad 831 and a source coupled to the VSS pad 832. The bulks of the transistors 851, 852 and 853 are respectively coupled to the VSS pad 832, VDD pad 831 and VSS pad 832.

The operation is similar to that of the circuit in FIG. 7A. The maximum of the gate voltage of the transistor 853 is Vd1+Vd2+ . . . +Vdn+Vth where Vd1, Vd2, . . . , and Vdn are the turn-on voltages of the diodes 81, and Vth is the threshold voltage of the transistor 851. Thus, by changing the number of diodes 81, the gate voltage of the transistor 853 is tunable.

Figure 8B:
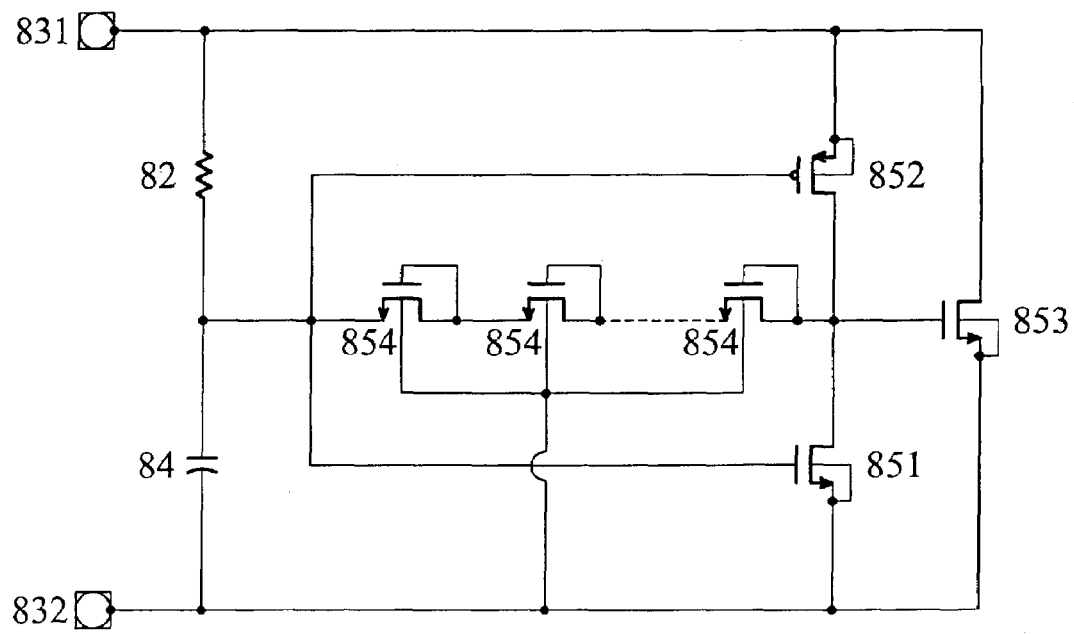
Figure 8C:
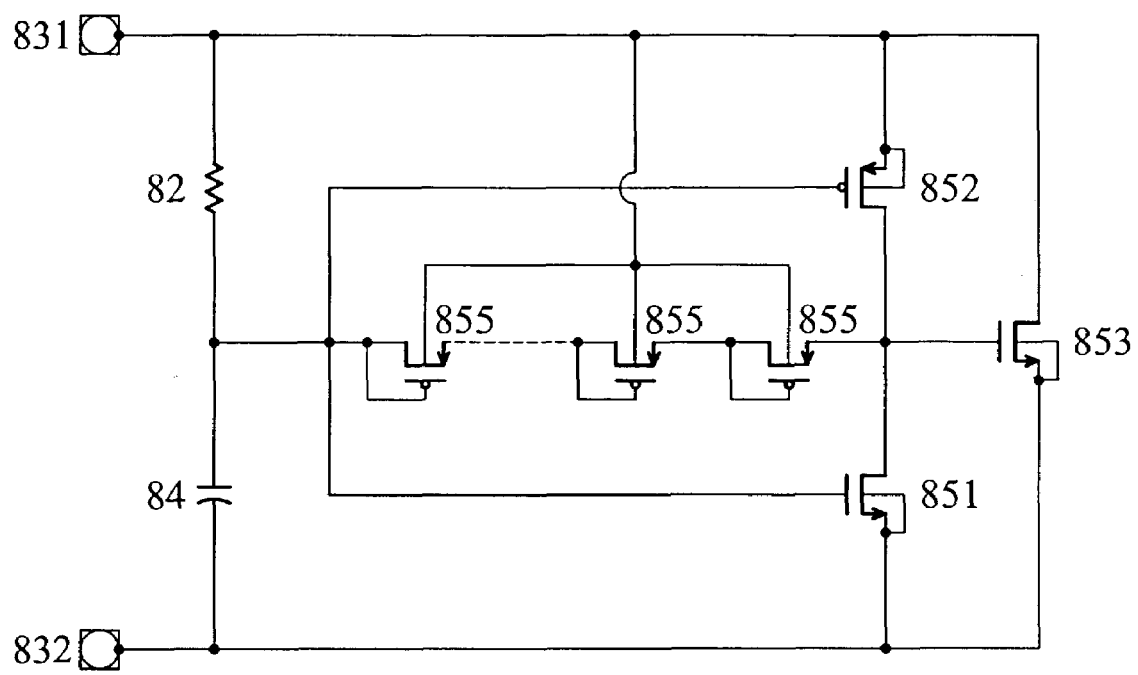
Figure 8D:
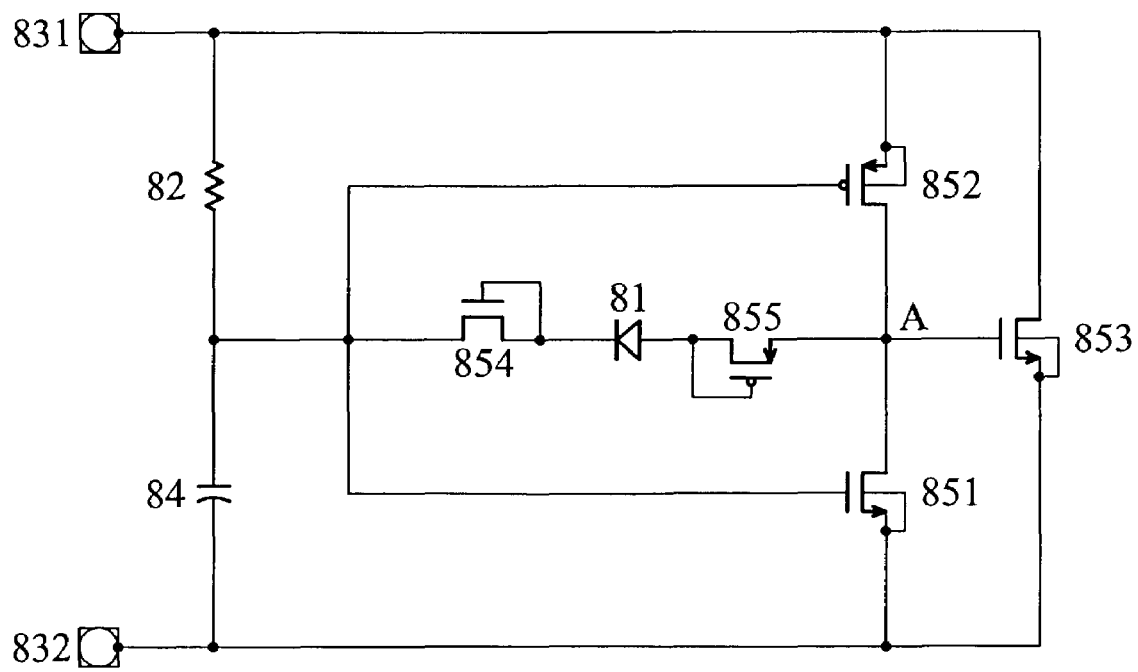

Alternatively, the diodes 81 may be replaced by NMOS transistors 854, each having a drain used as the anode, a source used as the cathode, a bulk coupled to the VSS pad 832, and a gate coupled to the drain, as shown in FIG. 8B. The diodes 81 may be also replaced by PMOS transistors 855, each having a drain used as the cathode, a source used as the anode, a bulk coupled to the VDD pad 831, and a gate coupled to the drain, as shown in FIG. 8C, or by one of combinations of the NMOS transistor 854 and PMOS transistor 855, as shown in FIG. 8D.

Figure 9A:
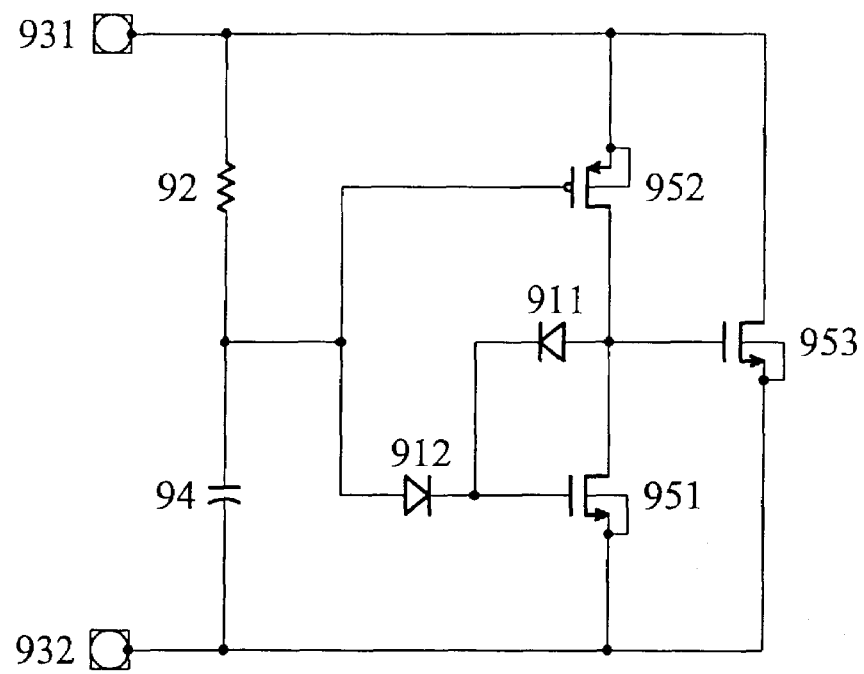
FIGS. 9A, 9B and 9C are diagrams showing a gate-driven ESD protection circuit and its alternatives according to a third embodiment of the invention.

FIG. 9A is a diagram showing a gate-driven ESD protection circuit placed between the power supply voltage source VDD and the substrate bias voltage source VSS pads according to a third embodiment of the invention. The ESD protection circuit includes a diode 911, a diode 912 with the cathode coupled to the cathode of the diode 911, a resistor 92 coupled between the anode of the diode 912 and a VDD pad 931, a capacitor 94 coupled between the anode of the diode 912 and a VSS pad 932, an NMOS transistor 951 having a gate coupled to the cathode of the diode 911, a drain coupled to the anode of the diode 911 and a source coupled to the VSS pad 932, a PMOS transistor having a gate coupled to the anode of the diode 912, a drain coupled to the anode of the diode 911 and a source coupled to the VDD pad 931, and an NMOS transistor 953 having a gate coupled to the anode of the diode 911, a drain coupled to the VDD pad 931 and a source coupled to the VSS pad 932. The bulks of the transistors 951, 952 and 953 are respectively coupled to the VSS pad 932, VDD pad 931 and VSS pad 932.

When a positive ESD pulse is applied to the VDD pad 931, there is a large transient voltage difference across the resistor 92 due to the RC delay with the capacitor 94. This voltage difference turns on the PMOS transistor 952, which increases the gate voltage of the NMOS transistor 953. The gate voltage of the NMOS transistor 953 is limited by the diode 911 and NMOS transistor 951, and has a maximum of Vd+Vth, where Vd is the turn-on voltage of the diode 911 and Vth is the threshold voltage of the transistor 951. The diode 912 is turned off since the voltage on its cathode increases faster than the voltage on its anode which increases at a speed controlled by an RC constant of the resistor 92 and capacitor 94, which isolates the RC circuit of the resistor 92 and capacitor 94 from the cathode of the diode 911. Therefore, the turn-on time of NMOS 953 can be adjusted more easily.

Figure 9B:
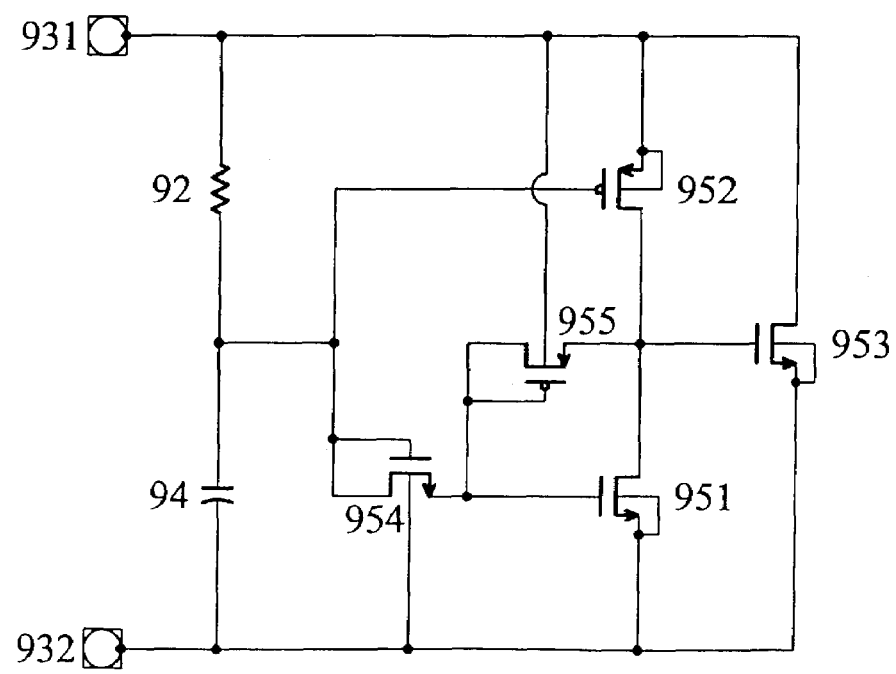
Figure 9C:
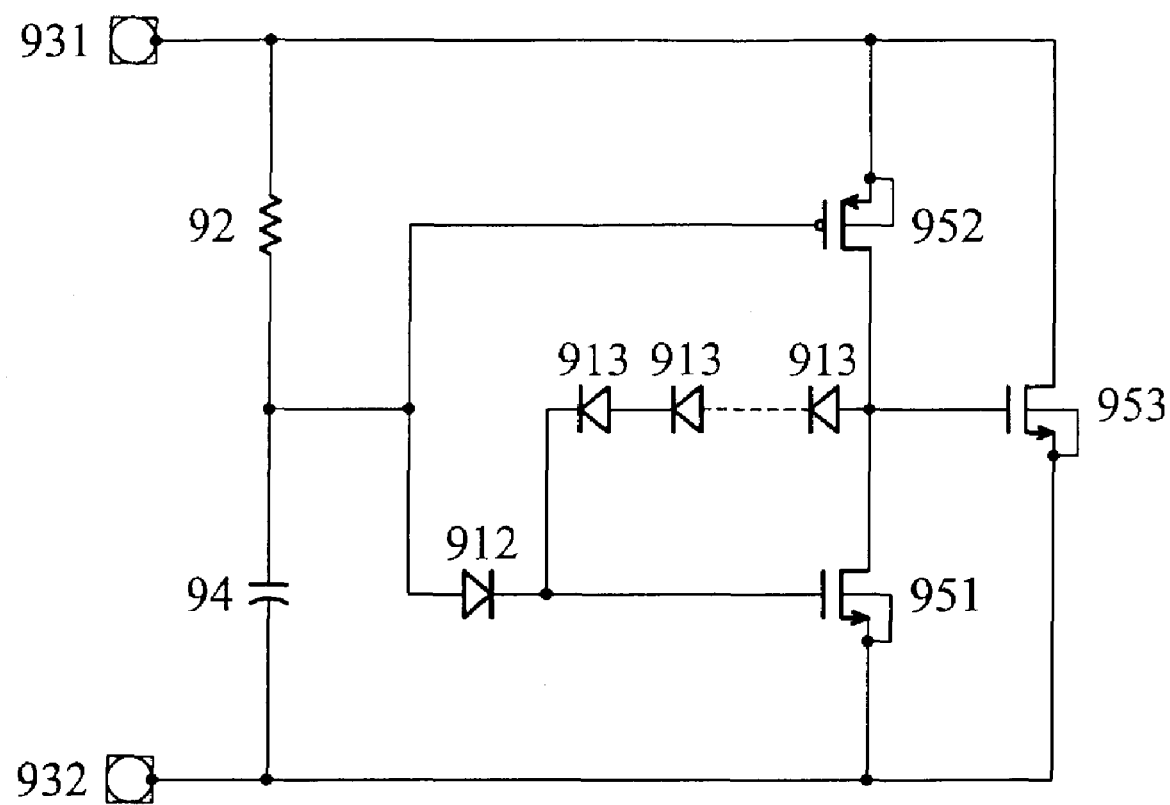

Alternatively, the diode 912 may be replaced by an NMOS transistor 954 having a drain used as the anode, a source used as the cathode, a bulk coupled to the VSS pad 932, and a gate coupled to the drain while the diode 911 may be replaced by a PMOS transistor 955 having a drain used as the cathode, a source used as the anode, a bulk coupled to the VDD pad 931, and a gate coupled to the drain, as shown in FIG. 9B. The diode 911 may be also replaced by a series of diodes 913 coupled in the same direction having an anode A and a cathode Z on each end, wherein the gate voltage of the transistor 953 is tunable by changing the number of the diodes 913, as shown in FIG. 9C.

Figure 10A:
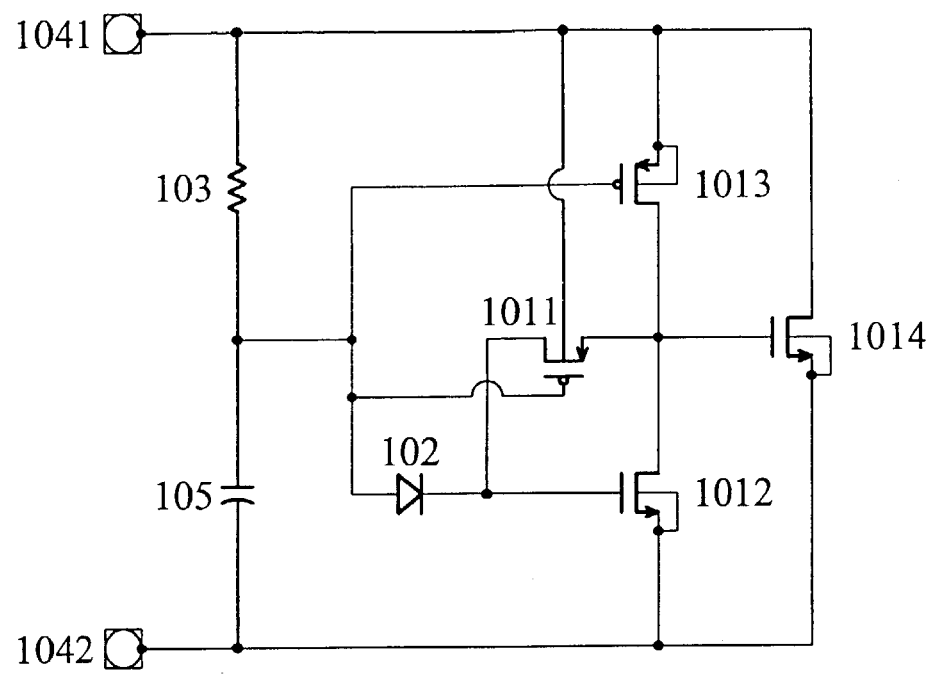
FIGS. 10A and 10B are diagrams showing a gate-driven ESD protection circuit and its alternatives according to a fourth embodiment of the invention.

FIG. 10A is a diagram showing a gate-driven ESD protection circuit placed between the power supply voltage source VDD and the substrate bias voltage source VSS pads according to a fourth embodiment of the invention. The ESD protection circuit includes a PMOS transistor 1011, a diode 102 having a cathode and anode respectively coupled to a drain and gate of the transistor 1011, a resistor 103 coupled between the anode of the diode 102 and a VDD pad 1041, a capacitor 105 coupled between the anode of the diode 102 and a VSS pad 1042, an NMOS transistor 1012 having a gate coupled to the cathode of the diode 102, a drain coupled to a source of the transistor 1011 and a source coupled to the VSS pad 1042, a PMOS transistor 1013 having a gate coupled to the anode of the diode 102, a drain coupled to the source of the transistor 1011 and a source coupled to the VDD pad 1041, and an NMOS transistor 1014 having a gate coupled to the source of the transistor 1011, a drain coupled to the VDD pad 1041 and a source coupled to the VSS pad

1042. The bulks of the transistors 1011, 1012, 1013, and 1014 are respectively coupled to the VDD pad 1041, VSS pad 1042, VDD pad 1041 and VSS pad 1042.

When a positive ESD pulse is applied to the VDD pad 1041, there is a large transient voltage difference across the resistor 103 due to the RC delay with the capacitor 105. This voltage difference turns on the PMOS transistor 1013, which increases the gate voltage of the NMOS transistor 1014. The PMOS transistor 1011 will be soon turned on since the source voltage increases faster than its gate voltage which increases at a speed controlled by an RC constant of the resistor 103 and capacitor 105. The gate voltage of the NMOS transistor 1014 is limited by the NMOS transistor 1012, and has a maximum of Vth, where Vth is the threshold voltage of the transistor 1012.

Figure 10B:
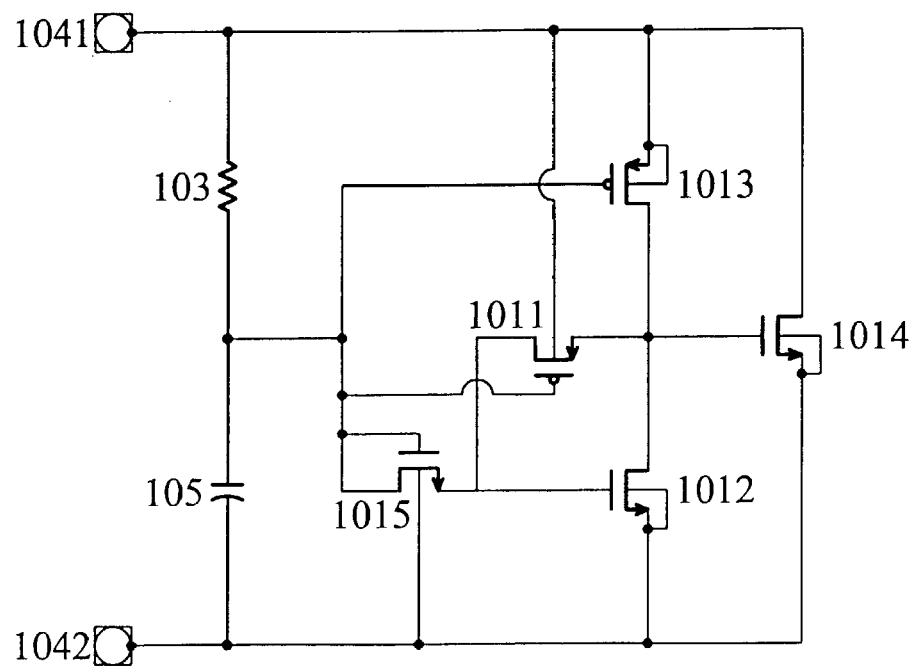

Alternatively, the diode 102 may be replaced by an NMOS transistor 1015 having a drain used as the anode, a source used as the cathode, a bulk coupled to the VSS pad 1042, and a gate coupled to the drain, as shown in FIG. 10B. The diode 102 may be also replaced by a PMOS transistor (not shown) having a drain used as the cathode, a source used as the anode, a bulk coupled to the VDD pad 1041, and a gate coupled to the drain.

Figure 11A:
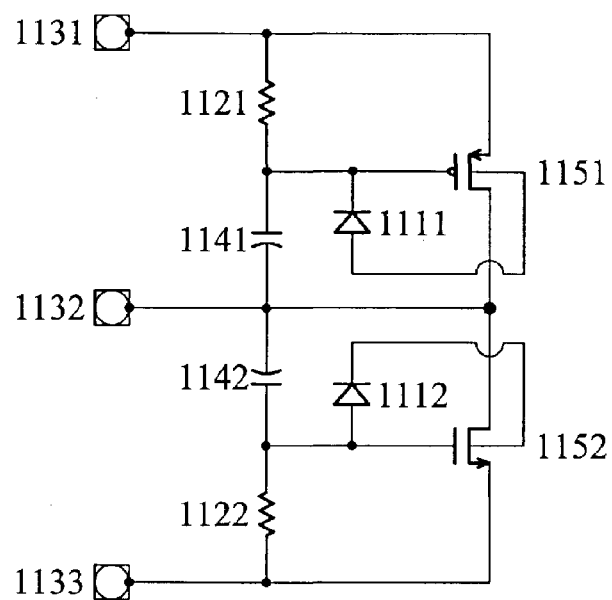
FIGS. 11A and 11B are diagrams showing a gate-coupled input ESD protection circuit and its alternatives according to a fifth embodiment of the invention.

FIG. 11A is a diagram showing a gate-coupled input ESD protection circuit according to a fifth embodiment of the invention. The ESD protection circuit includes a diode 1111, a resistor 1121 coupled between the cathode of the diode 1111 and a VDD pad 1131, a capacitor 1141 coupled between the cathode of the diode 1111 and an input pad 1132, a PMOS transistor 1151 having a gate coupled to the cathode of the diode 1111, a drain coupled to the input pad 1132, a source coupled to the VDD pad 1131 and a bulk coupled to the anode of the diode 1111, a diode 1112, a resistor 1122 coupled between the anode of the diode 1112 and a VSS pad 1133, a capacitor 1142 coupled between the anode of the diode 1112 and the input pad 1132, an NMOS transistor 1152 having a gate coupled to the anode of the diode 1112, a drain coupled to the input pad 1132, a source coupled to the VSS pad 1133 and a bulk coupled to the cathode of the diode 1112.

Figure 11B:
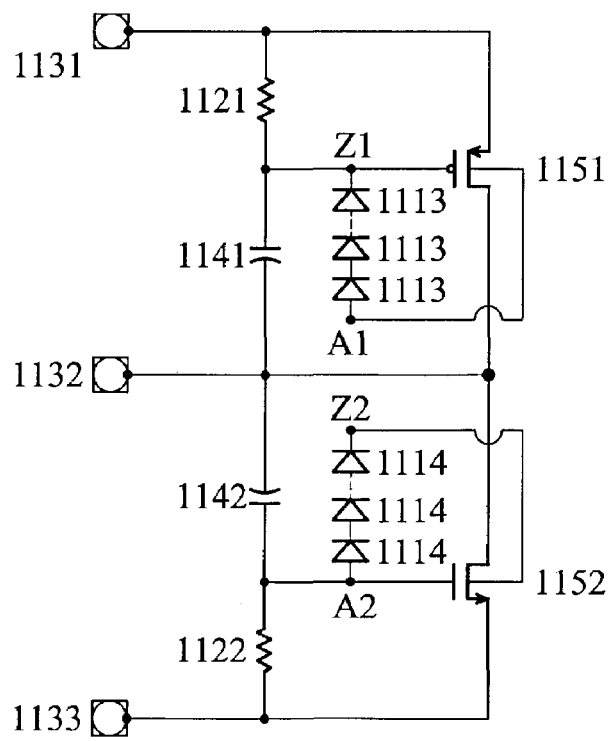

Alternatively, the diodes 1111 may be replaced by a series of diodes 1113 coupled in the same direction having an anode A1 and cathode Z1 on each end while the diodes 1112 may be replaced by a series of diodes 1114 coupled in the same direction having an anode A2 and cathode Z2 on each end, wherein the gate voltages of the transistors 1151 and 1152 are tunable by changing the numbers of the diodes 1113 and 1114, as shown in FIG. 11B. Any one of the diodes may be an NMOS transistor having a drain used as the anode, a source used as the cathode, a bulk coupled to the VSS pad 1133, and a gate coupled to the drain, or a PMOS transistor having a drain used as the cathode, a source used as the anode, a bulk coupled to the VDD pad 1131, and a gate coupled to the drain.

Figure 12A:
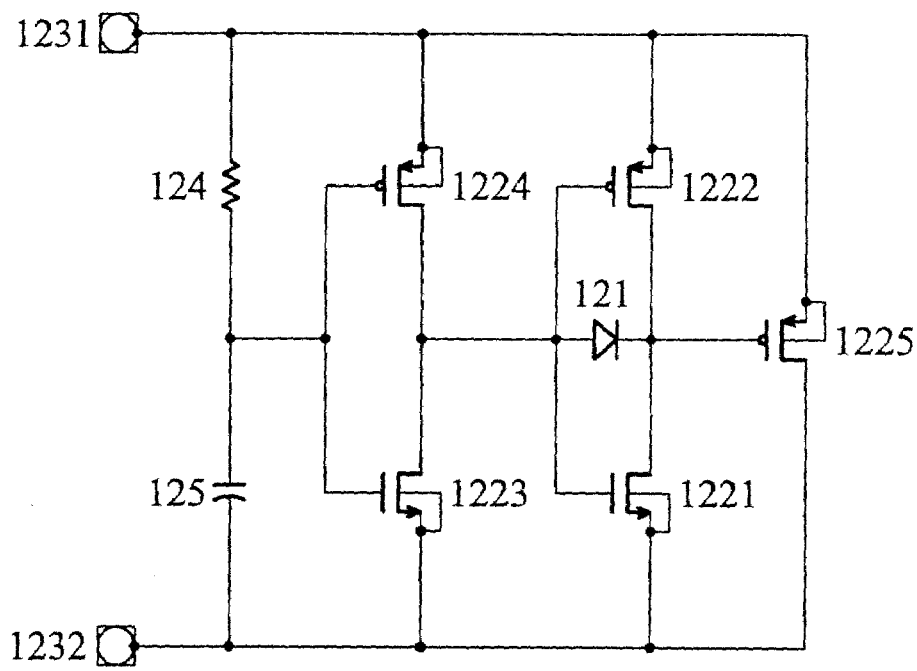
FIGS. 12A and 12B are diagrams showing a gate-driven ESD protection circuit and its alternatives according to a sixth embodiment of the invention.

FIG. 12A is a diagram showing a gate-driven ESD protection circuit placed between the power supply voltage source VDD and the substrate bias voltage source VSS pads according to a sixth embodiment of the invention. The ESD protection circuit includes a diode 121, an NMOS transistor 1221 having a gate coupled to the anode of the diode 121, a drain coupled to the cathode of the diode 121 and a source coupled to a VSS pad 1232, a PMOS transistor 1222 having a gate coupled to the anode of the diode 121, a drain coupled to the cathode of the diode 121 and a source coupled to a VDD pad 1231, an NMOS transistor 1223 having a gate, a drain coupled to the anode of the diode 121 and a source coupled to the VSS pad 1232, a PMOS transistor 1224 having a gate coupled to the gate of the transistor 1223, a drain coupled to the anode of the diode 121 and a source coupled to the VDD pad 1231, a PMOS transistor 1225 having a gate coupled to the cathode of the diode 121, a source coupled to the VDD pad 1231 and a drain coupled to the VSS pad 1232, a resistor 124 coupled between the gate of the transistor 1223 and the VDD pad 1231, and a capacitor 125 coupled between the gate of the transistor 1223 and the VSS pad 1232. The bulks of the transistors 1221, 1222, 1223, 1224, and 1225 are respectively coupled to the VSS pad 1232, VDD pad 1231, VSS pad 1232, VDD pad 1231, and VDD pad 1231.

When a positive ESD pulse is applied to the VDD pad 1231, there is a large transient voltage difference across the resistor 124 due to the RC delay with the capacitor 125. This voltage difference turns on the PMOS transistor 1224, which increases the gate voltage of the NMOS transistor 1221 and turns it on. As the transistor 1221 is turned on, the gate voltage of the PMOS transistor 1225 is pulled down to VSS. The gate voltage of the PMOS transistor 1225 is limited by the diode 121 and the PMOS transistor 1222, and has a minimum of VDD−Vth−Vd, where Vd is the turn-on voltage of the diode 121 and Vth is the threshold voltage of the transistor 1222.

Figure 12B:
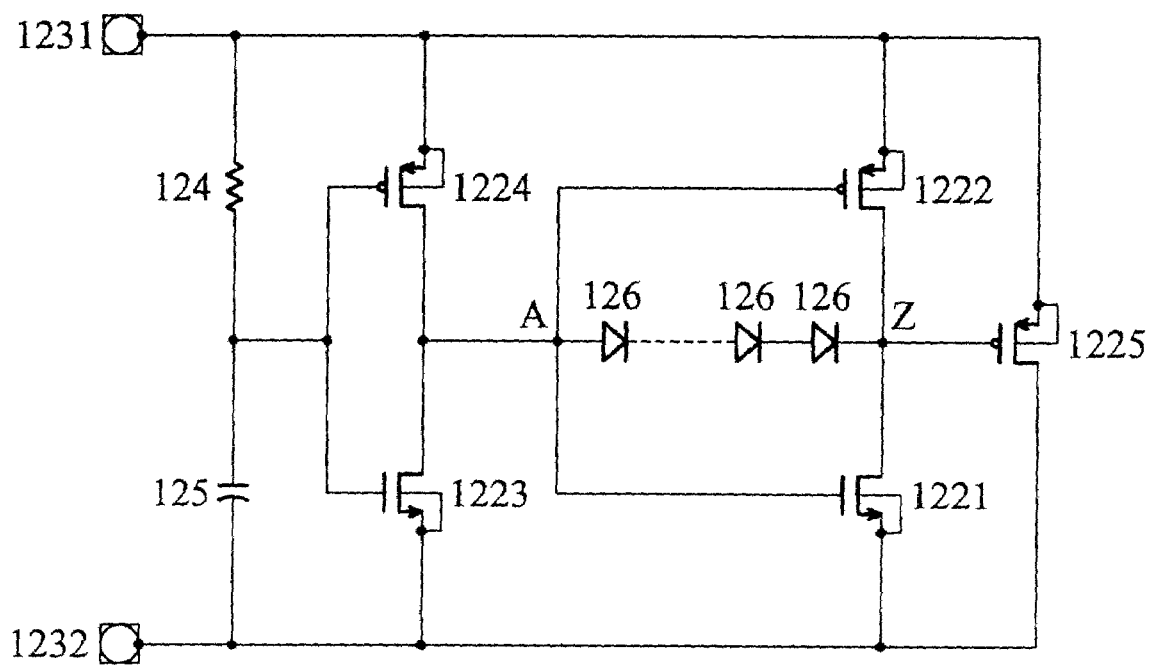

Alternatively, the diodes 121 may be replaced by a series of diodes 126 coupled in the same direction having an anode A and a cathode Z on each end, wherein the gate voltage of the transistor 1225 is tunable by changing the number of diodes 126, as shown in FIG. 12B. Any one of the diodes may be an NMOS transistor having a drain used as the anode, a source used as the cathode, a bulk coupled to the VSS pad 1232, and a gate coupled to the drain, or a PMOS transistor having a drain used as the cathode, a source used as the anode, a bulk coupled to the VDD pad 1231, and a gate coupled to the drain.

In conclusion, the present invention provides novel ESD protection circuits with tunable gate-bias voltage, wherein the gate bias voltage of the ESD protection device can be easily set in the suitable range for improved turn-on uniformity and efficiency, without causing any degradation due to the overstress gate-driven effect.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. An ESD protection circuit with tunable gate-bias coupled between a first and second pad respectively for receiving a first and second power supply voltage, the ESD protection circuit comprising:

a diode having an anode and cathode;

a resistor coupled between the cathode of the diode and the first pad;

a capacitor coupled between the cathode of the diode and the second pad;

a first transistor of a first conductivity type having a gate coupled to the cathode of the diode, a drain coupled to the anode of the diode and a source coupled to the second pad;

a second transistor of a second conductivity type having a gate coupled to the cathode of the diode, a drain coupled to the anode of the diode and a source coupled to the first pad; and a third transistor of the first conductivity type having a gate coupled to the anode of the diode, a drain coupled to the first pad and a source coupled to the second pad.

2. The ESD protection circuit as claimed in claim 1, wherein the first transistor further comprises a bulk coupled to the second pad, the second transistor flirther comprises a bulk coupled to the first pad, the third transistor further comprises a bulk coupled to the second pad, and the diode is formed by a fourth transistor of the first conductivity type having a drain used as the anode, a source used as the cathode, a bulk coupled to the second pad, and a gate coupled to the drain, or the diode is formed by a fifth transistor of the second conductivity type having a drain used as the cathode, a source used as the anode, a bulk coupled to the first pad, and a gate coupled to the drain.

3. An ESD protection circuit with tunable gate-bias coupled between a first and second pad respectively for receiving a first and second power supply voltage, the ESD protection circuit comprising:
a series of diodes coupled in the same direction having an anode and cathode on the ends of the series of diodes;
a resistor coupled between the cathode and the first pad;
a capacitor coupled between the cathode and the second pad;
a first transistor of a first conductivity type having a gate coupled to the cathode, a drain coupled to the anode and a source coupled to the second pad;
a second transistor of a second conductivity type having a gate coupled to the cathode, a drain coupled to the anode and a source coupled to the first pad; and
a third transistor of the first conductivity type having a gate coupled to the anode, a drain coupled to the first pad and a source coupled to the second pad.

4. The ESD protection circuit as claimed in claim 3, wherein the first transistor flirther comprises a bulk coupled to the second pad, the second transistor further comprises a bulk coupled to the first pad, the third transistor further comprises a bulk coupled to the second pad, and one of the diodes is formed by a fourth transistor of the first conductivity type having a drain used as the anode, a source used as the cathode, a bulk coupled to the second pad, and a gate coupled to the drain, or one of the diodes is formed by a fifth transistor of the second conductivity type having a drain used as the cathode, a source used as the anode, a bulk coupled to the first pad, and a gate coupled to the drain.

5. An ESD protection circuit with tunable gate-bias coupled between a first and second pad respectively far receiving a first and second power supply voltage, the ESD protection circuit comprising:
a first diode having an anode and cathode;
a second diode having an anode and cathode, wherein the cathode is coupled to the cathode of the first diode;
a resistor coupled between the anode of the second diode and the first pad;
a capacitor coupled between the anode of the second diode and the second pad;
a first transistor of a first conductivity type having a gate coupled to the cathode of the first diode, a drain coupled to the anode of the first diode and a source coupled to the second pad;
a second transistor of a second conductivity type having a gate coupled to the anode of the second diode, a drain coupled to the anode of the first diode and a source coupled to the first pad; and
a third transistor of the first conductivity type having a gate coupled to the anode of the first diode, a drain coupled to the First pad and a source coupled to the second pad.

6. The ESD protection circuit as claimed in claim 5, wherein the first transistor further comprises a bulk coupled to the second pad, the second transistor further comprises a bulk coupled to the first pad and the third transistor flirther comprises a bulk coupled to the second pad, and one of the first and second diodes is formed by a fourth transistor of the first conductivity type having h drain used as the anode, a source used as the cathode, a bulk coupled to the second pad, and a gate coupled to the drain, or one of the first and second diodes is formed by a fifth transistor of the second conductivity type having a drain used as the cathode, a source used as the anode, a bulk coupled to the first pad, and a gate coupled to the drain.

7. An ESD protection circuit with tunable gate-bias coupled between a first and second pad respectively for receiving a first and second power supply voltage, the ESD protection circuit comprising:
a series of first diodes coupled in a same direction having an anode and cathode on the ends of the series of first diodes;
a second diode having an anode and a cathode, wherein the cathode is coupled to the cathode of the series of the first diodes;
a resistor coupled between die anode of the second diode and the first pad;
a capacitor coupled between the anode of the second diode and the second pad;
a first transistor of a first conductivity type having a gate coupled to the cathode of the series of the first diodes, a drain coupled to the anode of the series of the first diodes and a source coupled to the second pad;
a second transistor of a second conductivity type having a gate coupled to the anode of the second diode, a drain coupled to the anode of the series of the first diodes and a source coupled to the first pad; and
a third transistor of the first conductivity type having a gate coupled to the anode of the series of the first diodes, a drain coupled to the first pad and a source coupled to the second pad.

8. The ESD protection circuit as claimed in claim 7, wherein the first transistor further comprises a bulk coupled to the second pad, the second transistor further comprises a bulk coupled to the first pad and the third transistor further comprises a bulk coupled to the second pad, and one of the first and second diodes is formed by a fourth transistor of the first conductivity type having a drain used as the anode, a source used as the cathode, a bulk coupled to the second pad, and a gate coupled to the drain, or one of the first and second diodes is formed by a fifth transistor of the second conductivity type having a drain used as the cathode, a source used as the anode, a bulk coupled to the first pad, and a gate coupled to the drain.

9. An ESD protection circuit with tunable gate-bias coupled between a first and second pad respectively for receiving a first and second power supply voltage, die ESD protection circuit comprising:
a first transistor of a second conductivity type;
a diode having a cathode and anodes respectively coupled to a drain and gate of the first transistor;
a resistor coupled between the anode of the diode and the first pad;

a capacitor coupled between the anode of the diode and the second pad;

a second transistor of a first conductivity type having a gate coupled to the cathode of the diode, a drain coupled to a source of the first transistor and a source coupled to the second pad;

a third transistor of the second conductivity type having a gate coupled to the anode of the diode, a drain coupled to the source of the first transistor and a source coupled to the first pad; and a fourth transistor of the first conductivity type having a gate coupled to the source of the first transistor, a drain coupled to the first pad and a source coupled to the second pad.

10. The ESD protection circuit as claimed in claim 9, wherein the first transistor thither comprises a bulk coupled to the first pad, the second transistor further comprises a bulk coupled to the second pad, the third transistor further comprises a bulk coupled to the first pad and the fourth transistor further comprises a bulk coupled to the second pad, and each of the first and second diodes is formed by a fifth transistor of the first conductivity type having a drain used as the anode, a source used as the cathode, a bulk coupled to the second pad, and a gate coupled to the drain, or each of the first and second diodes is formed by a sixth transistor of the second conductivity type having a drain used as the cathode, a source used as the anode, a bulk coup led to the first pad, and a gate coupled to the drain.

11. An ESD protection circuit with tunable gate-bias coupled between a first and second pad respectively for receiving a first and second power supply voltage, the ESD protection circuit comprising:

a diode having an anode and cathode;

a first transistor of a first conductivity type having a gate coupled to the anode of the diode, a drain coupled to the cathode of the diode and a source coupled to the second pad;

a second transistor of a second conductivity type having a gate coupled to the anode of the diode, a drain coupled to the cathode of the diode and a source coupled to the first pad;

a third transistor of the first conductivity type having a gate, a drain coupled to the anode of the diode, and a source coupled to the second pad;

a fourth transistor of the second conductivity type having a gate coupled to the gate of the third transistor, a drain coupled to the anode of the diode and a source coupled to the first pad;

a fifth transistor of the second conductivity type having a gate coupled to the cathode of the diode, a source coupled to the first pad and a drain coupled to the second pad;

a resistor coupled between the gate of the third transistor and the first pad; and a capacitor coupled between the gate of the third transistor and the second pad.

12. The ESD protection circuit as claimed in claim 11, wherein the first transistor further comprises a bulk coupled to the second pad, the second transistor further comprises a bulk coupled to the first pad, the third transistor further comprises a bulk coupled to the second pad, the fourth transistor further comprises a bulk coupled to the first pad and the fifth transistor further comprises a bulk coupled to the first pad, and the diode is a sixth transistor of the first conductivity type having a drain used as the anode, a source used as the cathode, a bulk coupled to the second pad, and a gate coupled to the drain, or the diode is a seventh transistor of the second conductivity type having a drain used as the cathode, a source used as the anode, a bulk coupled to the first pad, and a gate coupled to the drain.

* * * * *